United States Patent [19]

Chandra et al.

[11] Patent Number: 5,517,432
[45] Date of Patent: May 14, 1996

[54] FINITE STATE MACHINE TRANSITION ANALYZER

[75] Inventors: Susheel Chandra, Fremont; Shardul Kazi, San Jose; Jim Yeh, Pleasanton, all of Calif.

[73] Assignees: Sony Corporation of Japan; Sony Electronics, Inc., both of Park Ridge, N.J.

[21] Appl. No.: 189,494

[22] Filed: Jan. 31, 1994

[51] Int. Cl.$^6$ ............................................. G06F 19/00
[52] U.S. Cl. .................................. 364/578.1; 364/490
[58] Field of Search ............................ 364/578, 488, 364/489, 490; 395/600

[56] References Cited

U.S. PATENT DOCUMENTS

| | | | |
|---|---|---|---|
| 5,161,115 | 11/1992 | Teshima et al. | 364/551.01 |
| 5,220,512 | 6/1993 | Watkins et al. | 364/489 |
| 5,222,030 | 6/1993 | Dangelo et al. | 364/489 |
| 5,228,040 | 7/1993 | Agrawal et al. | 371/22.1 |
| 5,461,573 | 10/1995 | Chakradhar et al. | 364/489 |

*Primary Examiner*—Michael Zanelli
*Attorney, Agent, or Firm*—Irell & Manella

[57] ABSTRACT

A state machine synthesis tool, a state table script generator, a state table extraction tool, a simulation driver, a simulator, and an interactive reporter, are provided to verify the design and implementation of finite state machines (FSMs). The synthesis tool takes a formal specification of a logic circuit where FSMs are embedded as input, and generates a gate level specification of the logic circuit. The state table script generator takes the same formal specification of the logic circuit as input, and generates state table extraction command files for the FSMs. The state table extraction tool takes the gate level specification of the logic circuit and the state table extraction command files of the FSMs as inputs, and generates state tables for the FSMs. The simulation driver takes the state tables of the FSMs as inputs, and in cooperation with the simulator, which takes the gate level specification of the logic circuit and a number of functional vectors as inputs, simulates the logic circuit and generates simulation results of the FSMs. Finally, the interactive reporter takes the simulation results of the FSMs, the state tables and user commands as inputs, and generates the analysis results that allow verification of the design and implementation of the FSMs.

18 Claims, 5 Drawing Sheets

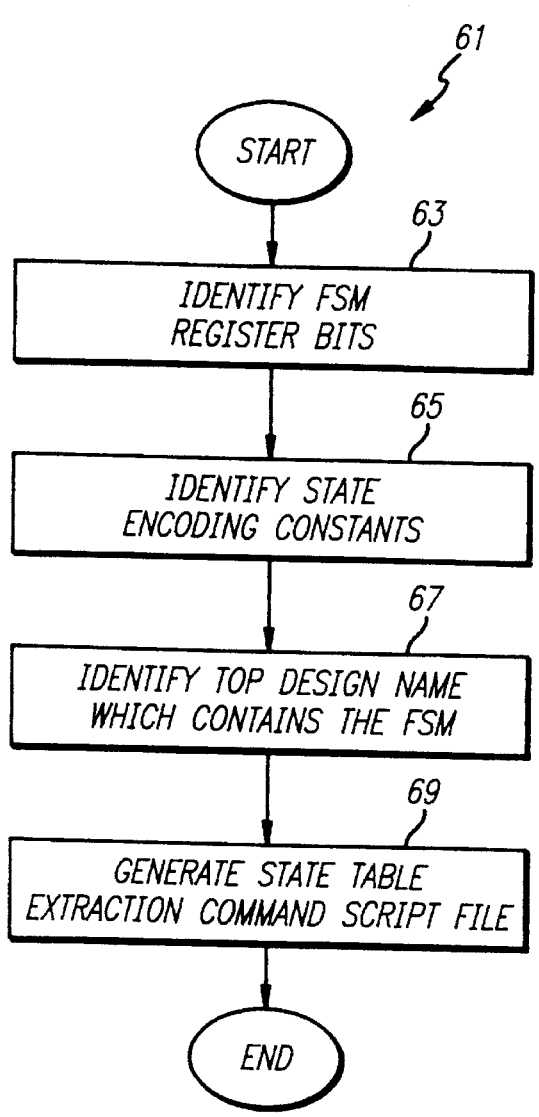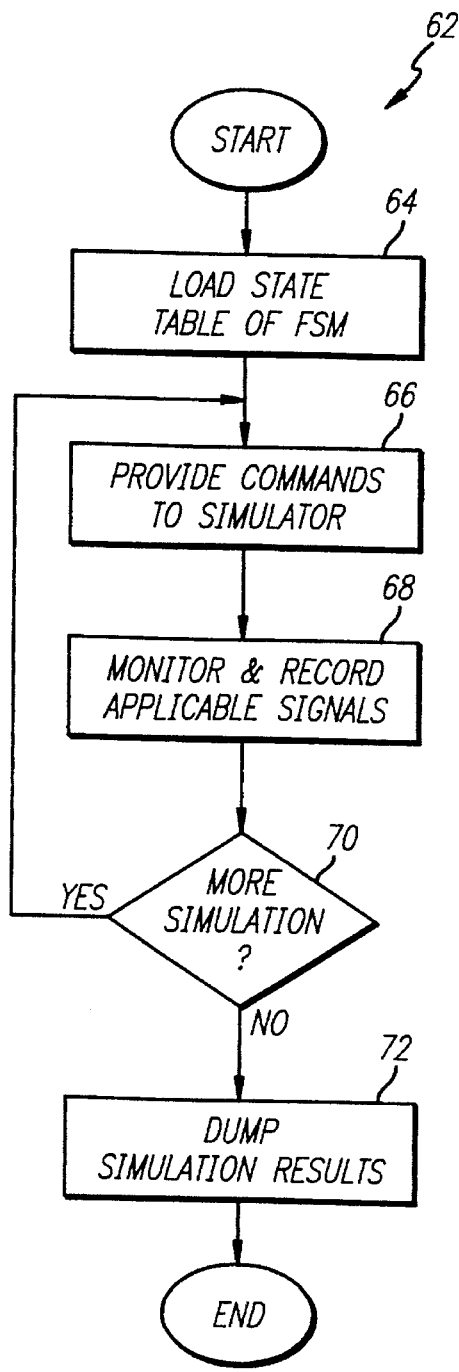

FIG. 7

STATE TABLE EXTRACTION COMMAND SCRIPT FILE  —46 read_f verilog "formal spec_name"
set_fsm_state_vector {...}
set_fsm_encoding {...}
extract_reachable
reduce_fsm
.
.
.

STATE TABLE

| INPUT | PRESENT STATE | NEXT STATE | OUTPUT |
|---|---|---|---|
|  |  |  |  |

FIG. 8

SIMULATION RESULTS

| CLOCK | INPUT | STATE | OUTPUT |
|---|---|---|---|
|  |  |  |  |

FIG. 9

FINITE STATE MACHINE TRANSITION ANALYZER

BACKGROUND OF THE INVENTION

1. Field of the Invention

The present invention relates to the field of integrated circuit design, more specifically, the verification of integrated circuit design. In particular, the present invention relates to the analysis and verification of finite state machines embedded in very large scale integrated circuit designs.

2. Background

Finite state machines (FSMs) are an integral part of any logic circuit. They are typically used in control logic, where the output depends not only on the current input to the circuit, but on the cumulative effect of all previous inputs. An FSM, therefore, can be considered as an abstract model describing a synchronous sequential machine. In this model, the effect of all previous inputs on the output is described by the present state or current state of the machine. In other words, if I is the set of possible input combinations, Z is the set of possible outputs, and Q is the set of possible states, then whenever $I_j \epsilon I$ is applied when the machine is in a state $Q_l \epsilon Q$, the output $Z_k \epsilon Z$ is generated and the machine goes to state $Q_m \epsilon Q$, where both $Z_k$ and $Q_m$ are uniquely determined by $I_j$ and $Q_l$.

FSMs are typically used to implement complex decision sequences, and can therefore be very difficult to validate, particularly after they are embedded as part of a very large integrated circuit design. There are two basic problems to be addressed in the verification of finite state machines. The first problem deals with design verification and the second one deals with implementation verification. Design verification addresses the issue of whether the system has been correctly specified. This can only be done through simulation of a model of the entire logic circuit. Typically, a High-level Design Language (HDL) is used to model the logic circuit and functional/diagnostic tests are developed to exercise the circuit design using a simulator. Thus, it is often difficult if not outright impossible to verify the design of FSMs. Therefore, it is desirable to be able to analyze and verify FSMs even after they are embedded as part of a very large integrated circuit. Implementation verification on the other hand, attempts to compare the HDL description with its implementation. With advances in synthesis algorithms, implementation verification is becoming less important since the synthesized implementation is typically correct by construction. Nevertheless, it is still desirable to be able to verify the implementation of FSMs. As will be disclosed, the present invention provides a state machine transition analyzer that advantageously allow verification of the design and implementation of FSMs.

SUMMARY OF THE INVENTION

The state machine transition analyzer of the present invention comprises a state machine synthesis tool, a state table command script generator, a state table extraction tool, a simulation driver, a simulator, and an interactive reporter. The synthesis tool takes a formal specification of a logic circuit where the FSMs are embedded as input, and generates a gate level specification of the logic circuit. The state table command script generator takes the same formal specification of the logic circuit as input, and generates state table extraction command script files for the FSMs. The state table extraction tool takes the gate level specification of the logic circuit and the state table extraction command files of the FSMs as inputs, and generates state tables for the FSMs. The simulation driver takes the state tables of the FSMs as inputs, and in cooperation with the simulator, which takes the gate level specification of the logic circuit and a number of functional vectors as inputs, simulates the logic circuit and generates simulation results for the FSMs. Finally, the interactive reporter takes the simulation results of the FSMs, the state tables, and user commands as inputs, and generates the analysis results that allow verification of the design and implementation of the FSMs.

In one embodiment, commercially available packages are used for the synthesis tool, the state table extraction tool, and the simulator. The state table command script generator, the simulation driver and monitor, and the interactive reporter are custom built. The state table command script generator reads the formal specification of a logic circuit and generates an executable state table extraction command file for the logic circuit. The simulation driver and monitor, upon start up, first loads the state table of a FSM. Next, the simulation driver and monitor iteratively drives the simulator, causing the simulator to simulate the processing of a number of function vectors by the logic circuit. At the same time, the simulation driver and monitor logs all clock, input, state, and output changes of the FSM. At the end of the simulation, the simulation driver and monitor dumps the logged data for the FSM. The interactive reporter comprises a command interpreter, a loader, a database, and a set of function routines supporting a number of functions for performing design and implementation verification of the FSM using the dumped data. The interactive reporter loads the state table and simulation results of the FSM into its database in response to user commands. In response to additional user commands, the interactive reporter provides analysis reports containing the necessary information for verifying the design and implementation of the FSM.

BRIEF DESCRIPTION OF THE DRAWINGS;

FIG. 4 illustrates the state table command script generator in further detail.

FIG. 5 illustrates the simulation driver and monitor of the state machine transition analyzer in further detail.

FIG. 7 illustrates an exemplary generated state table extraction command script file.

FIG. 8 illustrates the state table of a FSM.

FIG. 9 illustrates the simulation results of a FSM.

DETAILED DESCRIPTION PRESENTLY PREFERRED AND ALTERNATE EMBODIMENTS

In the following description, for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatic or block diagram form in order not to obscure the present invention unnecessarily.

Figure 1:
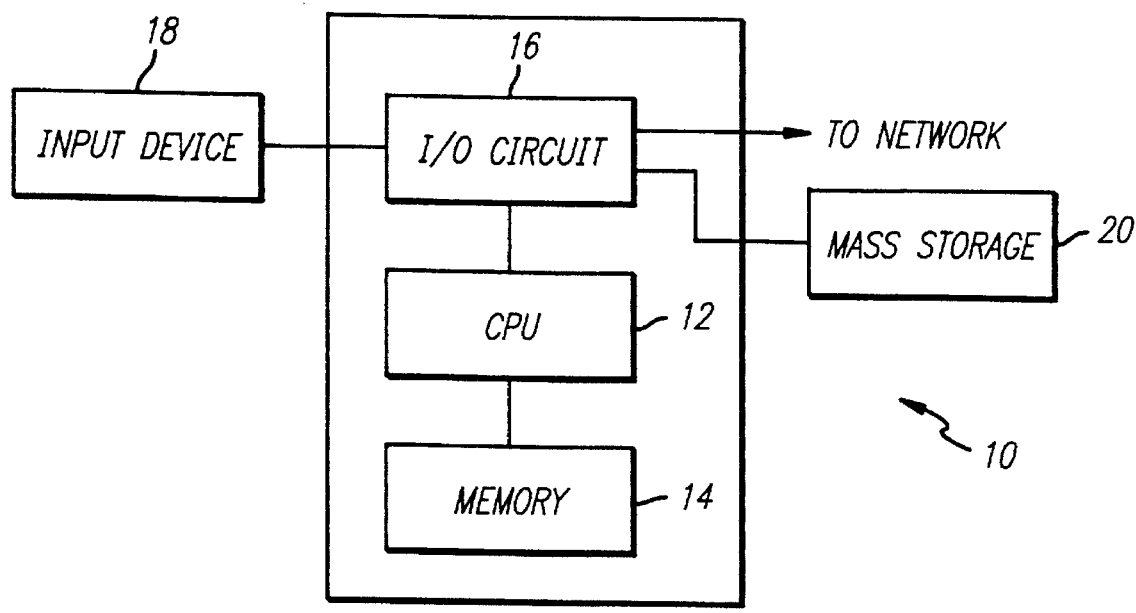
FIG. 1 is a system view of an exemplary computer system incorporating the teachings of the present invention.

Referring now to FIG. 1, a block diagram illustrating an exemplary computer system incorporating the teachings of the present invention is shown. The exemplary computer system 10 comprises a CPU 12, a memory 14, an I/O circuit 16, an input device 18, and a mass storage 20. The memory 14 and the I/O circuit 16 are coupled to the CPU 12, whereas, the input device 18 and the mass storage 20 are coupled to the I/O circuit 16. These elements 12–20 are intended to represent a broad categories of CPU, memory, etc. found in most computer systems. Their constitutions and functions are well known and will not be further described.

Figure 2:
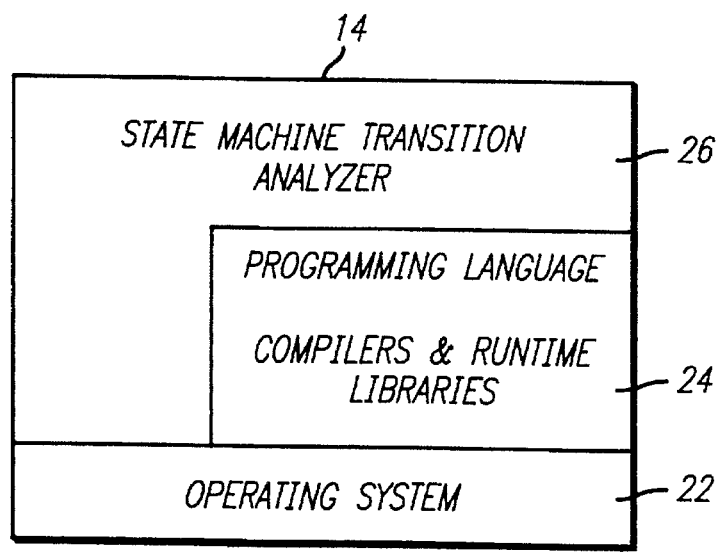
FIG. 2 illustrates the content of the memory of the exemplary computer system of FIG. 1 in further detail.

Referring now to FIG. 2, a block diagram illustrating the content of the memory 14 of the computer system 10 of FIG. 1 in further detail is shown. Shown is an operating system 22, a number of programming language compilers and runtime libraries 24, and the state machine transition analyzer 26 of the present invention. The state machine transition analyzer 26 will be described in further detail below with additional references to the remaining figures. The operating system 22 and the compilers and runtime libraries 24 are intended to represent a broad category of theses system and subsystem software. Their constitutions and functions are also well known and will not be described further. Additionally, based on the descriptions to follow, it will be appreciated that the present invention may be practiced with other supporting system and sub-system software.

Figure 3:
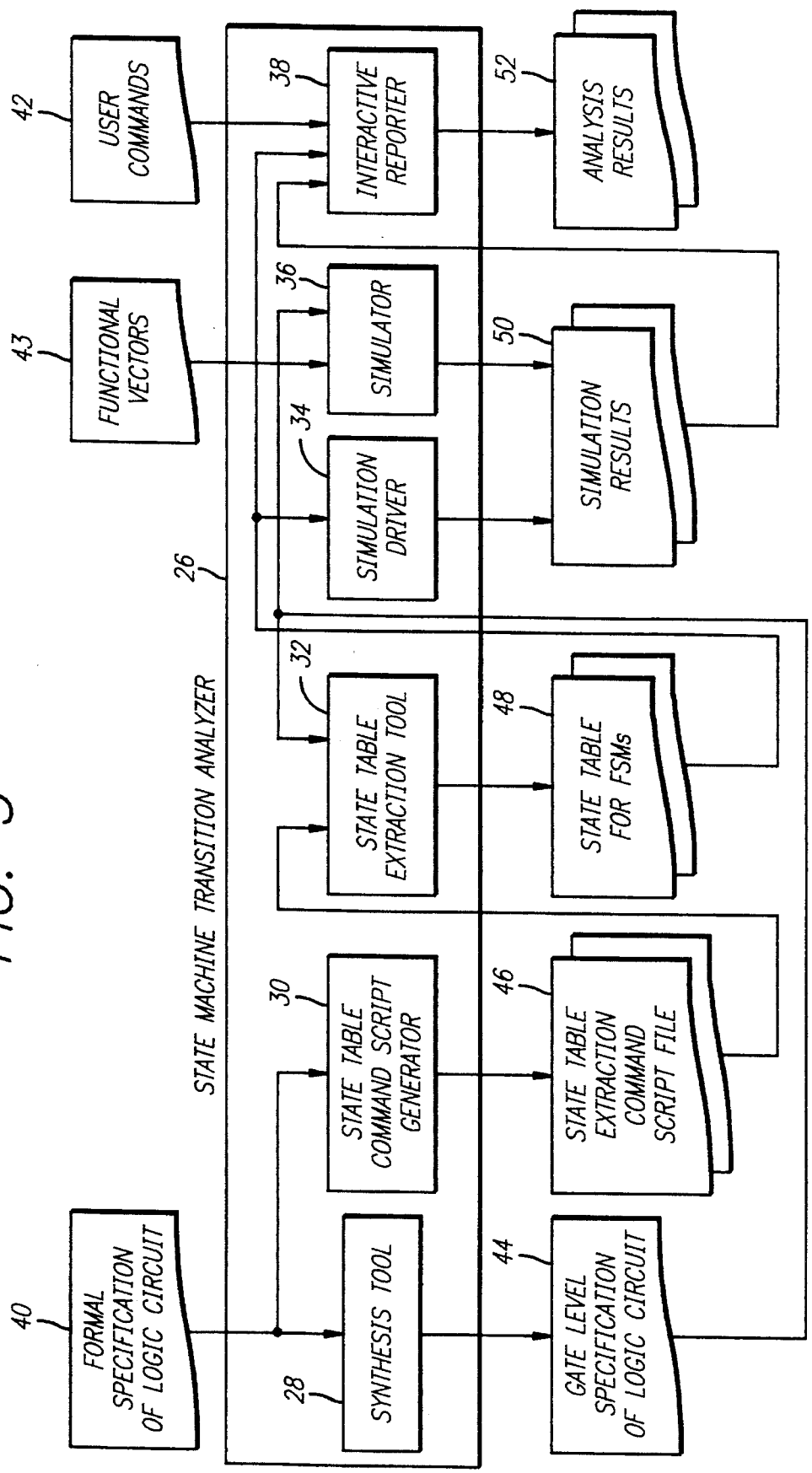
FIG. 3 is a functional block diagram of the state machine transition analyzer of the present invention.

Referring now to FIG. 3, a block diagram illustrating the state machine transition analyzer of the present invention is shown. The state machine transition analyzer 26 of the present invention comprises a state machine synthesis tool 28, a state table command script generator 30, a state table extraction tool 32, a simulation driver 34, a simulator 36, and an interactive reporter 38. The synthesis tool 28 takes a formal specification 40 of a logic circuit where the FSMs are embedded as input, and generates a gate level specification 44 of the logic circuit. The state table command script generator 30 takes the same formal specification 40 of the logic circuit as input, and generates state table extraction command script files 46 for the FSMs. The state table extraction tool 32 takes the gate level specification 44 of the logic circuit and the state table extraction command script files 46 of the FSMs as inputs, and generates state tables 48 for the FSMs. The simulation driver 34 takes the state tables of the FSMs as inputs, and in cooperation with the simulator 36, which takes the gate level specification 44 of the logic circuit and a number of function vectors 43 as inputs, simulates the logic circuit and generates simulation results 50 for the FSMs. Finally, the interactive reporter 38 takes the simulation results 50 of the FSMs and user commands 42 as inputs, and generates the analysis results 52 that allow verification of the design and implementation of the FSMs.

The formal specification 40 of the logic circuit includes the encoding of the various states, and the state registers, i.e. the memory devices containing the state values. The formal specification 40 further includes embedded comments with predetermined syntax for identifying FSM register bits. The logic circuit may be formally specified using a number of formal specification languages. Preferably, the formal language used is a formal language supported by commercially available synthesis tool and simulator. A particular example of such formal languages is VERILOG. In one embodiment, commercially available packages are used for the synthesis tool 28, the state table extraction tool 32, and the simulator 34. A particular example of the simulator 34 is the simulation utility of the VERILOG system, produced by Cadence Design Systems, Inc., of San Jose, Calif. Particular example of the synthesis tool 28 and the state table extraction tool 32 are the synthesis and state table extraction utilities of the SYNOPSYS system, produced by Synopsys of Mountain View, California. For further descriptions of these various utilities, see the various product literature provided by the respective manufacturers. However, the state table command script generator 30, the simulation driver and monitor 34, and the interactive reporter 38 are custom built. They will be described in further detail below with references to FIGS. 4–6.

Referring now briefly to FIGS. 8 and 9, two block diagrams illustrating the state table of a FSM, and the simulation results of a FSM are shown. As illustrated in FIG. 8, the state table 48 of a FSM comprises a number of state transition row entries, each having four fields describing an input value 74, a present state value 76, a next state value 78, and an output value 80. As illustrated in FIG. 9, the simulated results 50 of a FSM comprises a number of change entries, each also having four fields describing a clock value 82, an input value 84, a state value 86, and an output value 88. In each change row entry, at least one of the four values 84–88 is different from the immediately preceding change row entry.

Referring now to FIG. 4, a block diagram illustrating the operational flow of the state table script generator in further detail is shown. The state table command script generator 30 reads the formal specification of a logic circuit 40. The state table command script generator 30 identifies the FSM register bits, using the embedded comments with predetermined syntax described earlier, step 63. The state table command script generator 30 further identifies the state encoding constants, step 65, and the top design name which contains the FSM, step 67. Then, the state table command script generator 30 generates the state table extraction command script file 46 based on these identified information. An exemplary state table extraction command script file 46 is illustrated in FIG. 7.

Referring now to FIG. 5, a block diagram illustrating the operational flow of the simulation driver and monitor in further detail is shown. The simulation driver and monitor, upon start up, first loads the state table of a FSM, step 64. Next, the simulation driver and monitor iteratively drives the simulator, step 66, causing the simulator to simulate the processing of a number of function vectors by the logic circuit. At the same time, the simulation driver and monitor monitors and logs all clock, input, state, and output changes of the FSM, step 68. At the end of the simulation, no branch of step 70, the simulation driver and monitor dumps the logged data for the FSM, step 72. Since commercial packages such as SYNOPSYS and VERILOG are preferred for the state table extractor and the simulator, and the format of the state table outputs and the programming interlaces are well known, the implementation of the simulation driver and monitor with the above described operational flow is well within the ability of one skilled in the art of circuitry design.

Figure 6:
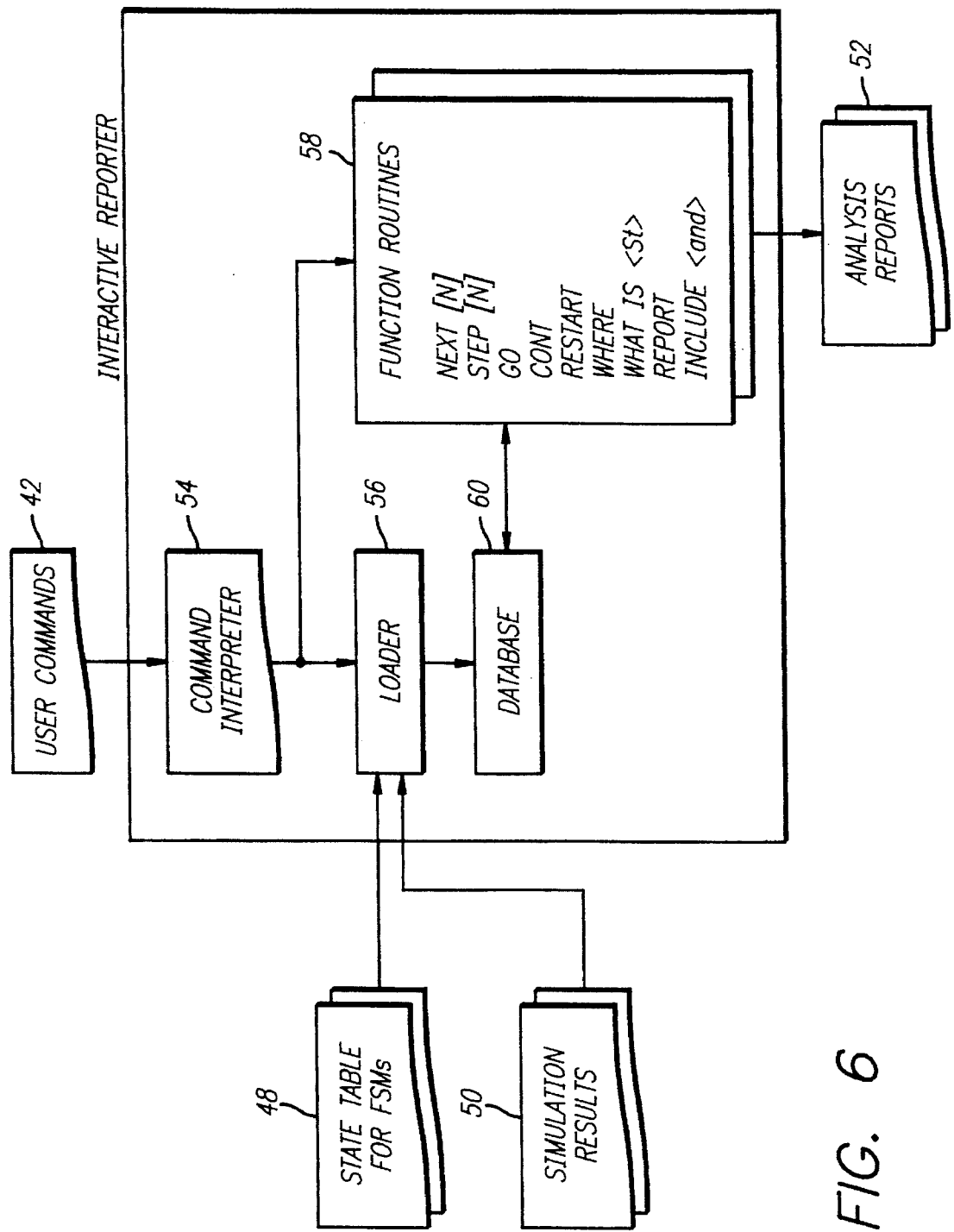
FIG. 6 illustrates the interactive reporter of the state machine transition analyzer in further detail.

Referring now to FIG. 6, a block diagram illustrating the major functions of the interactive reporter in further detail is shown. The interactive reporter 38 comprises a command interpreter 54, a loader 56, a database 60, and a number of function routines 58 supporting a number of functions for performing design and implementation verification of the FSM using the dumped data for the FSMs. Preferably, the loader 56 support a "read—st or—mon" command for loading the state table 48 and the simulation results 50 of a FSM, and the database 60 stores the state table 48 and the simulation results 50 of the FSM in a format that is suitable for fast queries and retrievals. Additionally, it is further preferred that the loading of simulation results of a FSM can be cumulative. For the function routines 58, it is preferred that they support the commands "next[n]" for tracing the state machine to the next output change, "step[n]" for tracing the state machine to the next input/ output change, "go" for tracing the state machine from start to end, "cont" for resuming trace from the current state, "where" for displaying the current state information and current transition coverage (transition coverage=number of transitions taken×100/total number of transitions possible), "whatis" for displaying the state information, such as a state name, "report" for reporting statistical information of a state or the state machine.

The command interpreter 54 interprets the user commands 42 and invokes the loader 56 and the appropriate function routines 58 accordingly. Initially, the interactive reporter 38 loads the state table 48 and simulation results 0 of the FSM into its database 60 in response to user commands 42. In response to additional user commands 42, the interactive reporter 38 provides the analysis reports 52 for a variety of verification information. In particular, with the preferred set of commands, a user can use the interactive reporter 38 to generate analysis reports 52 that provides answers to a. the number of state transitions taken and under what present state and input conditions, b. the state transitions that are not exercised by the functional vectors, c. the illegal state transitions attempted, d. whether any unreachable state exists in the FSM, e. the (cumulative) transition coverage provided by the functional vector set(s), and f. the areas of improvement for the function vector set(s).

From these answers, the user can verify the design and implementation of a FSM.

The command interpreter 54, the loader 56, the database 60, and the functional routines 58, with the above described functions and characteristics can all be implemented in a variety of manners, and they are all within the ability of one skilled in the art of circuitry design.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative of and not limiting on the present invention.

What is claimed is:

1. In a computer system comprising a formal specification of a logic circuit having at least one finite state machine (FSM) and at least one set of functional vectors for simulating the logic circuit, an apparatus for analyzing and verifying said at least one FSM's design and implementation, said apparatus comprising:

a) synthesis means for generating a gate level specification of said logic circuit in response to said formal specification of said logic circuit;

b) state table generation means comprising:

b.1) command script generation means for generating at least one state table extraction command script file for said at least one FSM in response to said formal specification of said logic circuit: and b.2) state table extraction means for generating said at least one state table for said at least one FSM in response to said gate level specification of said logic circuit and said at least one state table extraction command script file;

c) simulation means for simulating and generating simulation results of said at least one FSM in response to said gate level specification of said logic circuit, said at least one state table for said at least one FSM, and said at least one set of functional vectors; and d) reporting means for generating analysis reports in response to said simulation results of said at least one FSM and user inputs.

2. The apparatus as set forth in claim 1, wherein, said command script generation means reads said formal specification of said logic circuit, identifies FSM register bits, state encoding constants, and each top design name containing a FSM, and generates said at least one state table extraction command script file based on said identified bits, constants, and design names.

3. The apparatus as set forth in claim 1, wherein, said simulation means comprises c.1) driving and monitoring means for generating simulation commands, monitoring simulated signal changes, and generating simulation results for said at least one FSM, in response to said at least one state table for said at least one FSM; and c.2) a simulator coupled to said driving and monitoring means for simulating said logic circuit in response to said simulation commands, said gate level specification of said logic circuit and said at least one set of functional vectors.

4. The apparatus as set forth in claim 3, wherein, said driving and monitoring means, upon start up, loads said at least one state table for said at least one FSM;

said driving and monitoring means further iteratively generates simulation commands for said simulator, and records applicable signals generated by said simulator, for each FSM;

said driving and monitoring means, upon completion of simulation, further generates said simulation results for said at least one FSM based on said recorded applicable signals.

5. The apparatus as set forth in claim 1, wherein said reporting means comprises:

d.1) a command interpreter for interpreting user commands;

d.2) a loader cooperating with said command interpreter for loading said at least one state table and simulation results for said at least one FSM;

d.3) a database for storing said loaded at least one state table and said simulation results; and d.4) a plurality of function routines cooperating with said command interpreter and said database for performing a plurality of reporting and related functions.

6. The apparatus as set forth in claim 5, wherein, said loader responsive to user commands loads said simulation results in a cumulative manner.

7. The apparatus as set forth in claim 5, wherein, said function routines comprise:

d.4.1) a first function routine for tracing operation of a FSM to its next output change; and d.4.2) a second function routine for tracing operation of a FSM to its next input/output change.

8. The apparatus as set forth in claim 5, wherein, said function routines comprise:
   d.4.1) a first function routine for tracing operation of a FSM from start to end; and
   d.4.2) a second function routine for resuming tracing of operation of a FSM from its current state.

9. The apparatus as set forth in claim 5, wherein, said function routines comprise:
   d.4.1) a first function routine for displaying current state information and current transition coverage of a FSM; and
   d.4.2) a second function routine for displaying state information.

10. In a computer system comprising a formal specification of a logic circuit having at least one finite state machine (FSM) and at least one set of functional vectors for simulating the logic circuit, a method for analyzing and verifying said at least one FSM's design and implementation, said method comprising the steps of:
   a) generating a gate level specification of said logic circuit in response to said formal specification of said logic circuit;
   b) generating a state table for each of said at least one FSM in response to said formal specification of said logic circuit;
   c) simulating and generating simulation results of said at least one FSM in response to said gate level specification of said logic circuit, said at least one state table for said at least one FSM, and said at least one set of functional vectors; and
   d) generating analysis reports by the following steps:
      d.1) interpreting user commands;
      d.2) loading said at least one state table and simulation results for said at least one FSM responsive to said user commands;
      d.3) storing said loaded at least one state table and said simulation results; and
      d.4) performing a plurality of reporting and related functions responsive to said user commands.

11. The method as set forth in claim 10, wherein, said step b) comprises the steps of:
   b.1) generating at least one state table extraction command script file for said at least one FSM in response to said formal specification of said logic circuit; and
   b.2) generating said at least one state table for said at least one FSM in response to said gate level specification of said logic circuit and said at least one state table extraction command script file.

12. The method as set forth in claim 11, wherein, said step (b.1) comprises:
   (b.1.1) reading said formal specification of said logic circuit;
   (b.1.2) identifying FSM register bits, state encoding constants, and each top design name containing a FSM; and
   (b.1.3) generating said at least one state table extraction command script file based on said identified bits, constants, and design names.

13. The method as set forth in claim 11, wherein, said step (c) comprises the steps of:
   c.1) generating simulation commands, monitoring simulated signal changes, and generating simulation results for said at least one FSM, in response to said at least one state table for said at least one FSM; and
   c.2) simulating said logic circuit in response to said simulation commands, said gate level specification of said logic circuit and said at least one set of functional vectors.

14. The method as set forth in claim 13, wherein, said step (c.1) comprises the steps of:
   c.1.1) upon start up, loading said at least one state table for said at least one FSM;
   c.1.2) iteratively generating simulation commands for said simulator, and recording applicable signals generated by said simulator, for each FSM;
   c.1.3) upon completion of simulation, further generating said simulation results for said at least one FSM based on said recorded applicable signals.

15. The method as set forth in claim 10, wherein, said loading of state table and simulation results in said step (d.2) is performed in a cumulative manner.

16. The method as set forth in claim 10, wherein, said step (d.4) comprises the steps of:
   d.4.1) tracing operation of a FSM to its next output change; and
   d.4.2) tracing operation of a FSM to its next input/output change.

17. The method as set forth in claim 10, wherein, said step (d.4) comprises the steps of:
   d.4.1) tracing operation of a FSM from start to end; and
   d.4.2) resuming tracing of operation of a FSM from its current state.

18. The method as set forth in claim 10, wherein, said step (d.4) comprises the steps of:
   d.4.1) displaying current state information and current transition coverage of a FSM; and
   d.4.2) displaying state information.

* * * * *